United States Patent [19]
Douglas

[11] Patent Number: 5,381,059
[45] Date of Patent: Jan. 10, 1995

[54] CMOS TRISTATEABLE BUFFER

[75] Inventor: Kenneth R. Douglas, Sunnyvale, Calif.

[73] Assignee: Intel Corporation, Santa Clara, Calif.

[21] Appl. No.: 175,643

[22] Filed: Dec. 30, 1993

[51] Int. Cl.[6] ................. H03K 19/00; H03K 19/0175
[52] U.S. Cl. ...................................... 326/58; 326/68; 326/21
[58] Field of Search ............... 307/473, 475, 451, 443

[56] References Cited
U.S. PATENT DOCUMENTS

| | | | |
|---|---|---|---|
| 5,039,874 | 8/1991 | Anderson | 307/451 |
| 5,057,711 | 10/1991 | Lee et al. | 307/473 |
| 5,332,932 | 7/1994 | Runaldue | 307/451 |

Primary Examiner—Edward P. Westin
Assistant Examiner—Jon Santamauro
Attorney, Agent, or Firm—Blakely, Sokoloff, Taylor & Zafman

[57] ABSTRACT

A CMOS buffer for a mixed or singular voltage system includes an input stage circuit for converting input data compatible with transistor-transistor logic (TTL) levels to an internal signal compatible with CMOS logic levels. The buffer also includes an output driver circuit generating a pair of drive signals and a first pair of control signals in response to the internal signal. The output driver predriver circuitry also receives as inputs an enable signal for controlling the tristateablity of the buffer, and a mode signal for selecting between relatively fast versus slow output switching. A final stage circuit is configured to provide relatively fast switching at the output node when the mode signal is high, and relatively slow switching at the output node when the mode signal is low. A feedback circuit couples the input data signal to the output node as well as receiving the pair of drive signals from the output predriver circuit. The feedback circuit generates the second pair of control signals coupled to the final stage circuitry which prevents leakage current from flowing within the buffer whenever the buffer is in a tristate mode of operation and a relatively high voltage is applied to the output node.

11 Claims, 6 Drawing Sheets

CMOS TRISTATEABLE BUFFER

FIELD OF THE INVENTION

The present invention relates generally to the field of integrated circuits. Specifically, the invention pertains to input/output (I/O) buffers and tristateable output buffers fabricated using complimentary metal-oxide-semiconductor (CMOS) technology.

BACKGROUND OF THE INVENTION

In the semiconductor industry over the course of the past several years, there has emerged a trend toward the development of lower voltage, submicron processing technologies. For example, it is increasingly common to find semiconductor products that operate with supply voltages of 3.3 volts, rather than the traditional 5 volt levels. Problems arise, however, with building low voltage products which are to be compatible with existing products that utilize a higher power supply potential. One problem exists with the compatibility of conventional I/O buffers using CMOS low-voltage processing technology. If conventional output buffers are used in CMOS products operating with a low voltage supply, then current leakage problems may arise when higher voltages are driven into the output pad while the buffer is in a tristate mode. Obviously, current leakage problems are undesirable in an integrated circuit, especially in cases where the magnitude of the leakage violates accepted I/O bus standards.

Other problems also exist when tristateable output buffers operating from a low voltage supply are connected to a higher voltage bus. In addition to the leakage problem mentioned above, there are two long-term reliability issues to consider. These problems are commonly referred to as "hot electron reliability" and "p-device stability".

Hot electron reliability denotes the phenomenon wherein the operating performance of a transistor degrades due to a build up of trapped carriers in the gate oxide region. Because electron carriers have a higher mobility than hole carriers, this problem is more pronounced for n-channel devices as compared to p-channel devices.

The performance of a transistor degrades as the electric field of the trapped carriers interact with the electric field applied at the gate of the transistor. Hot electron reliability is a probabilistic model where the probability of a carrier being trapped in the oxide is a function of the energy of the carrier as it passes through the channel of the transistor. At the operating point of saturation, devices have the highest probability of injecting carriers into the gate oxide. Among the factors that determine if a transistor will experience hot electron reliability problems include: frequency of switching, size of load, operating temperature, driving potential, device channel length, device channel width, the rise-/fall times of the signal on the gate, and the expected lifetime of operation of the transistor in the field.

Another long-term reliability risk, referred to as p-device stability, involves the undesirable shift in the threshold voltage when excessive electric fields have been applied across the gate oxide of a p-channel transistor. Note that n-channel devices are also susceptible to a shift in their threshold voltage as a result of excessive electric fields being experienced across their gate oxide. However, p-channel devices, are usually more sensitive to this phenomena.

As will be seen, the present invention provides for a 5.0 volt tolerant output buffer ideally-suited for low voltage operation. The invented input/output buffer is compatible with CMOS processing technology while overcoming the aforementioned problems. Specifically, the present invention provides a tristateable CMOS output buffer that does not experience current leakage problems when supplied with 3.3 volts, and when 5 volts or higher is driven into the output pad while the buffer is tristated. The invented buffer circuit also addresses the problems associated with hot electron and p-device stability reliability requirements.

SUMMARY OF THE INVENTION

Accordingly, one object of the present invention is to provide an input/output CMOS buffer which meets the 5.0 volt transistor-transistor logic (TTL) specifications when powered with a supply voltage lower than 5.0 volts. Therefore, the buffer is capable of performing in a mixed voltage system.

Another object of the present invention is to provide a 5.0 volt tolerant CMOS output buffer which overcomes the aforementioned drawbacks when the buffer operates with supply voltages lower than 5.0 volts.

Still another object of the present invention is to provide a tristateable CMOS output buffer which includes a mechanism for altering and controlling the output buffer strength.

It is a further object of the present invention to provide an output buffer which utilizes near zero internal static current.

Still another object of the present invention is to provide a CMOS input circuit that allows operation in a mixed or singular voltage system.

These and other objects of the present invention are achieved, in one embodiment, by an output buffer operable from a low-voltage power supply. So that the buffer can handle voltages at the pad which are higher than the buffer's power supply voltage, the final stage utilizes a novel n-well biasing scheme which prevents leakage current. Additionally, feedback paths from the pad to the gates of the final stage p-channel devices achieve low leakage current. A plurality of n-channel devices coupled in series are also included in the final stage of one embodiment to satisfy a variety of reliability and performance criterion.

BRIEF DESCRIPTION OF THE DRAWINGS;

The present invention is illustrated by way of example and is not limited to the figures of the accompanying drawings, in which like references indicate similar elements, and in which.

DETAILED DESCRIPTION

A tristateable CMOS input/output (I/O) buffer is disclosed. In the following description, numerous specific details are set forth such as specific circuit configurations, logic gates, voltages, etc., in order to provide a thorough understanding of the present invention. It will be obvious, however, to one of ordinary skill in the art that these specific details need not be used to practice the invention. In other instances, well-known structures and circuits have not been shown in order to avoid unnecessarily obscuring the present invention.

In one embodiment, the present invention comprises a buffer for a CMOS sub-micron component that is supplied with 3.3 volts, and which communicates with another component supplied with 5.0 volts. It should be understood, however, that the present invention is not limited to these voltages in a mixed voltage system. That is, the invention is applicable to a variety of voltage combinations, e.g., a 2.4 volt supplied buffer operating with 3.3 V, 5.0 V, etc., devices.

DESCRIPTION OF THE PRIOR ART

Figure 1:
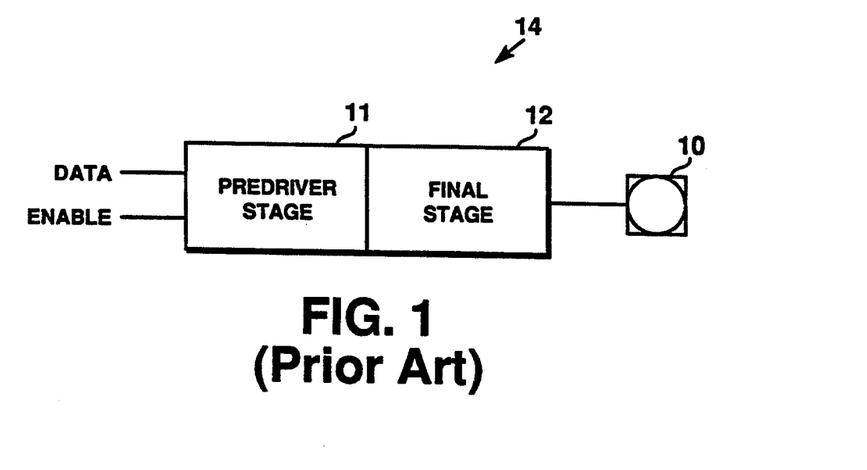
FIG. 1 illustrates the fundamental structure of a prior art CMOS tristateable output buffer.

FIG. 1 is a simplified diagram illustrating the fundamental structure of a prior art tristateable CMOS output buffer 14. Buffer 14 includes a predriver stage 11 which receives data and enable signals. The enable signal is utilized to control the tristate condition of the buffer. Typically, when the enable input is low the buffer is tristated, providing a high output impedance at output pad 10. Predriver stage 11 is coupled to the final output stage 12.

Figure 2:
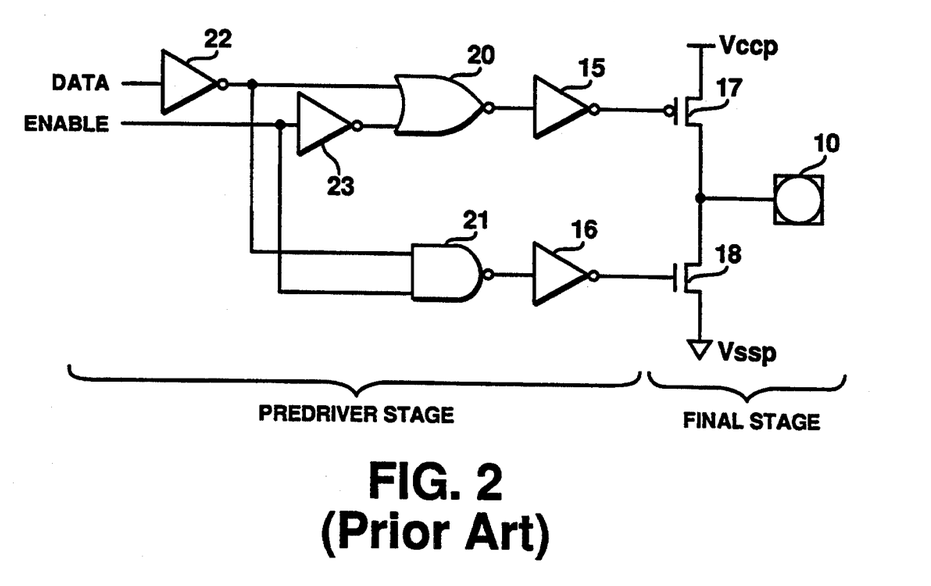
FIG. 2 is a schematic representation of a prior art tristateable output buffer.

With reference to FIG. 2, there is shown a schematic representation of a typical prior art tristateable output buffer. Consistent with the root structure of FIG. 1, the buffer of FIG. 2 includes predriver and final stages. The predriver stage includes inverter 22 which receives data at its input and has its output coupled to NOR gate 20 and NAND gate 21. The enable input is shown being coupled to the input of inverter 23 and to the other input of NAND gate 21. The output of inverter 23 is coupled to the second input of NOR gate 20. The outputs of NOR gate 20 and NAND gate 21 are respectively coupled to inverters 15 and 16. The final stage consists of p-channel device 17 coupled between supply voltage $V_{ccp}$ and output pad 10. An n-channel device 18 is shown coupled between output pad 10 and supply potential $V_{ssp}$. The gates of devices 17 and 18 are coupled to the outputs of inverters 15 and 16, respectively.

The buffer of FIG. 2 is tristated when the "enable" input is at a logical low level. Under this condition, the gate of n-channel device 18 is driven to ground ($V_{ssp}$), while the gate of p-channel device 17 is driven to the supply potential $V_{ccp}$. Thus, both devices 17 and 18 in the final stage are off. The buffer will remain tristated as long as the voltage on pad 10 remains above $V_{ssp}-V_{TN}$ (where $V_{TN}$ is the threshold voltage of device 18) and below $V_{ccp}+V_{TP}$ (where $V_{TP}$ is the threshold voltage of p-channel device 17). Normally, the magnitudes of $V_{TN}$ and $V_{TP}$ are targeted to be near 0.6 volts, with the source to well bias of zero volts.

Now consider a mixed voltage system where a conventional output buffer supplied with 3.3 volts is connected to another component that is supplied with and drives 5.0 volts. Under these conditions, $V_{ccp}+V_{TP}$ for the 3.3 volt buffer is approximately 3.9 volts. Therefore if pad 10 is driven above 3.9 volts, then device 17 turns on even if the enable input to the buffer is at a low voltage. With device 17 on, leakage current flows from pad 10 to the $V_{ccp}$ supply. Of course, such a situation is undesirable since it results in large standby leakage current.

Another undesirable path for leakage current under the aforementioned conditions is the pn-junction diode inherently formed at the junction of the p+ silicon source of the final stage p-channel device 17 connected to pad 10 and the n-well where the p-channel device resides. Typically, the n-bulk for p-channel devices is connected to the $V_{ccp}$ voltage for bias reasons. Therefore, if pad 10 is 5.0 V and the n-bulk is biased directly to 3.3 V, then the pn-junction diode is forward biased and a substantial current flows.

The output buffer of FIG. 2 is also prone to hot electron and p-device stability problems if voltages higher than $V_{ccp}$ are driven into the output pad 10. Thus, it can be seen that the conventional structure of FIG. 2 does not adequately meet the requirements of a tristateable CMOS output buffer having a 3.3 volt supply, when connected to a 5 volt bus.

DESCRIPTION OF THE PRESENT INVENTION

Figure 3:
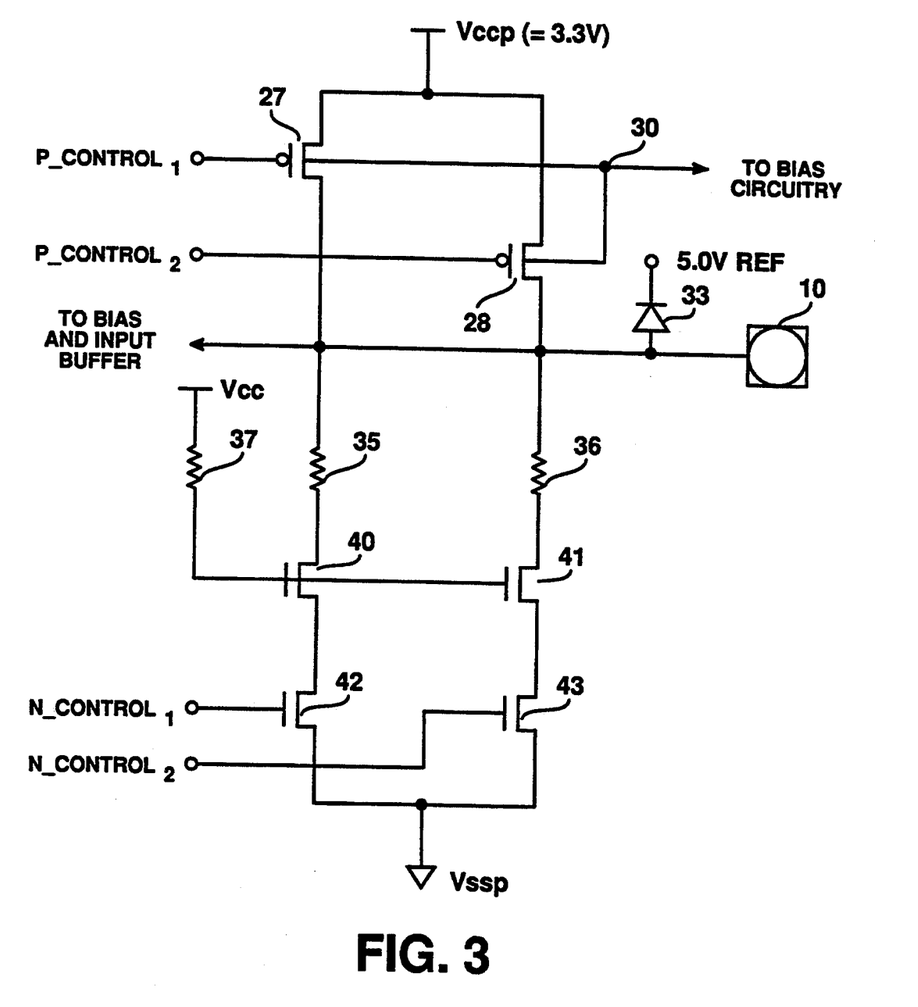
FIG. 3 illustrates one embodiment of the final stage circuitry utilized in the present invention.

With reference to FIG. 3 there is illustrated one embodiment of the final stage of the CMOS output buffer of the present invention. The output buffer final stage of FIG. 3 includes a pair of p-channel devices 27 and 28 which are coupled in parallel between supply potential $V_{ccp}$ (=3.3 volts) and pad 10. The gates of devices 27 and 28 are each coupled to control lines P_control$_1$ and P_control$_2$. At the same time, the bulk (i.e., n-well of the p-channel devices) is connected to special n-well bias circuitry. The bias circuitry is discussed in detail in conjunction with FIG. 4.

As can be seen, the final stage of FIG. 3 illustrates two separate paths or legs from output pad 10 to the ground supply potential $V_{ssp}$ (=0 volts). Each leg is essentially identical, with the first leg comprising the series connection of resistor 35, n-channel device 40 and n-channel device 42. The other leg comprises resistor 36 coupled in series with devices 41 and 43 between output pad 10 and $V_{ssp}$. The gates of devices 40 and 41 are coupled through resistors 37 to supply potential $V_{cc}$. Note that supply potential $V_{cc}$ is generally identical to supply potential $V_{ccp}$ (i.e., 3.3 volts), however, $V_{cc}$ represents the core potential, whereas $V_{ccp}$ represents the supply potential to the large switching elements of the periphery devices.

Sometimes it is useful to isolate the periphery devices from the core for noise considerations. For purposes of the invention, $V_{cc}$ and $V_{ccp}$ may be considered to be identical. Likewise, resistor 37 may optionally be connected to $V_{ccp}$. N-channel devices 42 and 43 have their gates coupled to separate control lines N_control$_1$ and N_control$_2$, respectively.

It is appreciated by practitioners in the art that the final stage illustrated in FIG. 3 contains duality, with each half or leg of the file stage being essentially identical. This provides flexibility in the drive strength of the buffer circuit. For example, the output buffer is reconfigurable since strong switching results when both final stage legs are activated. If weaker final stage switching is desired, then only one leg may be used. It should be understood that the sizes of the devices in each of the legs need not be equivalent and more than two legs may be used to achieve the feature of a variable drive strength buffer.

In another embodiment, the two parallel p-channel devices 27 and 28 of the pull-up paths may each consist of a stack of two or more p-channel devices connected in series. This alternative approach handles the hot carrier and threshold stability problems for the p-channel devices in a similar way as these problems were addressed in the current embodiment for the pull-down n-channel devices. This approach divides the voltage potential differentials into acceptable pieces and partitions the pieces among the different devices of the stack. Because the voltage potential between the pad and the ground supply is greater in the current embodiment as compared to the pull-up paths between the pad and the supply voltage, the embodiment shown includes a stack of two devices for the pull-down paths and only a single device for each pull-up path. However, it is reasonable to expect designs to use stacks of devices in series for both the pull-up and pull-down paths of the final stage of output buffers.

In a current embodiment, resistors 35 and 36 comprise 3 ohm n-well resistors, whereas resistor 37 comprises a 300 ohm polysilicon resistor. Resistors 35–37, along with pn-junction diode 33 are included in the circuit of FIG. 3 to provide improved ESD protection and output pad signal clamping.

Diode 33 is utilized for ESD protection and signal clamping. Due to the special bias circuitry coupled to the n-well of p-channel transistors 27 and 28 (i.e., the loss of the n-well to $V_{cc}$ connection of prior art) diode 33 is used. Diode 33 diverts large current impulses away from delicate microelectronics circuitry. If enhanced ESD protection and signal clamping were not desired, diode 33 may be eliminated. Alternatively, in another embodiment, the n-well bias circuitry and ESD diode is not required if the n-well containing the final stage p-channel devices is coupled directly to a higher voltage supply reference (i.e., 5.0 V REF in FIG. 3).

As discussed earlier, in order to avoid problems of hot electron degradation and p-device stability, the source-to-drain and gate-to-source/drain voltage potential of the transistors must be limited. These requirements are met by the circuit of FIG. 3 which includes a series of n-channel devices for pulling output pad 10 to a logical low level. Likewise, the tristated leakage specification mandates that the p devices of the pull-up paths be constructed within an n-well that is not biased to the normal $V_{ccp}$ supply line. According to the present invention, the specialized bias circuitry coupled to node 30 attracts the output pad voltage when the output is forced sufficiently above the $V_{ccp}$ supply.

To guarantee that no leakage current occurs in the final stage when the buffer is tristated, the gates of the final stage p-channel devices 27 and 28 are also made to track the output pad voltage when the voltage is greater than $V_{ccp}+V_{TP}$. To accomplish this criteria, circuit feedback paths from pad 10 to the gates of devices 27 and 28 are required. This aspect of the present invention will be discussed in more detail below.

Figure 4:
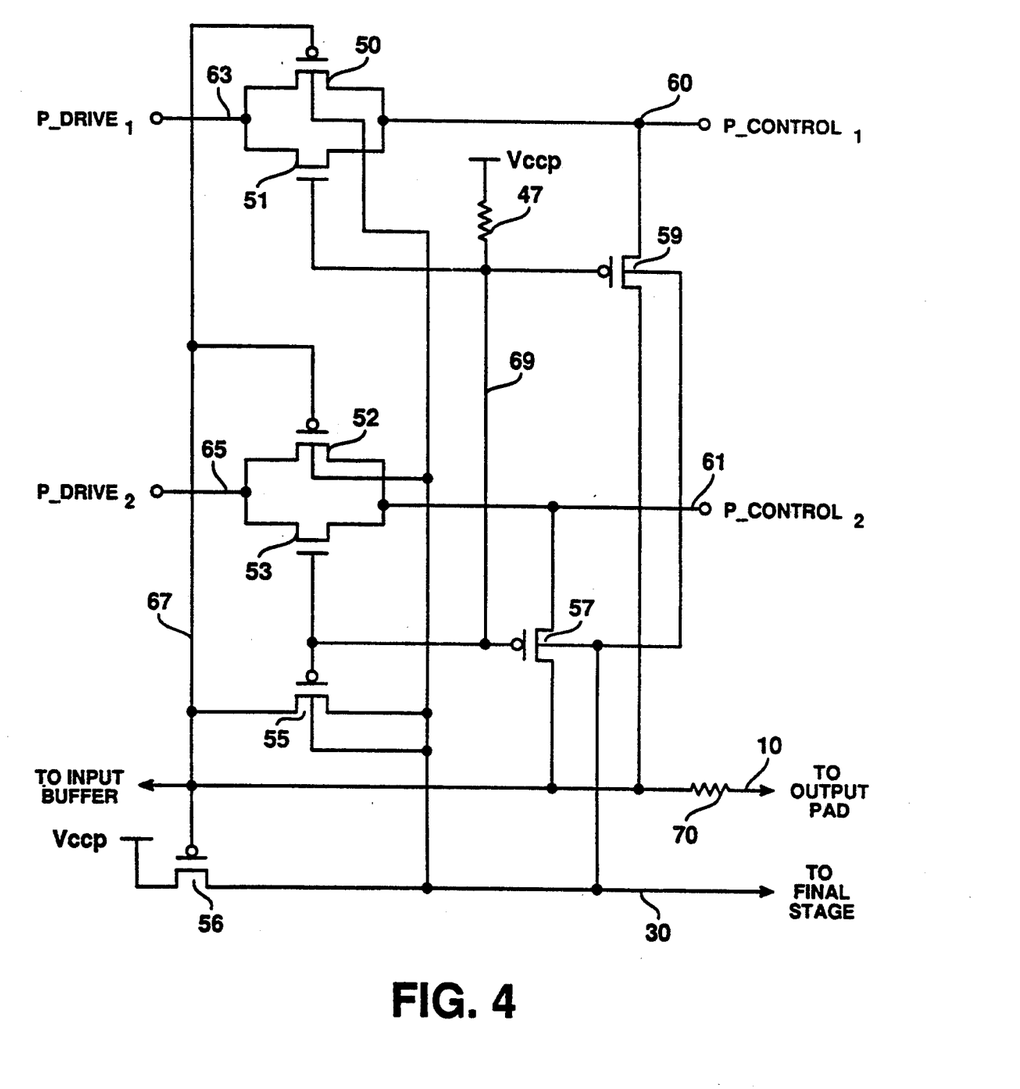
FIG. 4 is a circuit schematic of one embodiment of the n-well bias and p-device feedback circuitry utilized in the present invention.

FIG. 4 illustrates a circuit schematic of the special n-well bias circuitry and final stage feedback circuitry that prevents excessive leakage in the output buffer when pad 10 is connected to a 5 volt bus. In the circuit of FIG. 4, p-channel devices 57 and 59 are used to pull the voltage of the gates of the final stage p-channel transistors 28 and 27 to near the pad voltage when the pad voltage sufficiently exceeds the buffer's supply voltage. As can be seen, device 59 is coupled between node 60 and node 67, whereas device 57 is coupled between node 61 and node 67. Devices 57 and 59 are the final stage feedback circuitry required to keep devices 27 and 28 off in order to prevent excessive current. Node 60 comprises the signal line P_control$_1$, while node 61 represents signal line P_control$_2$. The n-wells of devices 59 and 57 are both coupled to node 30, which is common to the n-wells of the final stage p-channel devices. This may be achieved by having devices 59 and 57 resident in the same n-well as the final stage p-channel devices 27 and 28.

The circuit schematic of FIG. 4 also includes a pair of transmission gates for transferring the logical signals appearing at nodes 63 and 65 (labeled P_drive$_1$ and P_drive$_2$, respectively) to control nodes 60 and 61, respectively. For example, one transmission gate comprises p-channel device 50 and n-channel device 51 coupled in parallel between nodes 63 and 60. Similarly, the second transmission gate comprises devices 52 and 53 coupled and parallel between nodes 65 and 61. These transmission gates are employed in the present invention to prevent leakage current at the output pad when the output pad is externally driven to 5 volts when the buffer is tristated.

Note that when the buffer is tristated, nodes 63 and 65 are driven to the supply voltage of 3.3 volts. Therefore, if nodes 60 and 61 are pulled to 5.0 volts (by means of devices 57 and 59), contention will exist and a leakage current flows absent the presence of the two transmission gates. The two transmission gates stop the flow of current between the supply and the output pad under these conditions. (It is also worth noting that devices 50 and 52 share a common n-well bias with devices 57, 59, 27 and 28.)

P-channel devices 55 and 56 are utilized for n-well bias control. Device 55 allows the specially-biased n-well to contain the same voltage as the output pad when the output voltage is raised above $V_{ccp}+V_{TP}$. In the absence of device 55, the n-well regions would track the voltage at output pad 10 by virtue of the natural pn-junction which is formed between the drains of devices 28 and 27 and the n-well bulk. Absent device 55, however, the n-well voltage would follow the voltage at pad 10 minus a diode voltage drop. Thus, device 55 provides better operation in that the n-well bias follows the pad more closely when the pad voltage is above $V_{ccp}+V_{TP}$.

P-channel device 56 is utilized for biasing the n-well regions to the supply voltage $V_{ccp}$ (=3.3 volts) when the output pad 10 is at a voltage below the supply voltage. In this situation, when output pad 10 drops to a potential which is below $V_{ccp}-V_{TP}$, device 56 turns on and biases the n-well regions to the supply voltage $V_{ccp}$. Absent device 56, the n-well will still get some bias from $V_{ccp}$ minus a diode drop when the pad is at a voltage below $V_{ccp}$.

Note that the circuit of FIG. 4 includes a resistor 70, which in the current embodiment comprises a 150 ohm polysilicon resistor, coupled between the output pad 10 and the input buffer. Resistor 70 provides ESD protection by limiting the current that may flow into the feedback paths and input buffer. For additional ESD protection, polysilicon resistor 47 is included coupled between nodes 69 and supply potential $V_{ccp}$. Resistor 47 couples the gates of transistors 59, 57, 53, 55, and 51 to the supply voltage.

Figure 5:
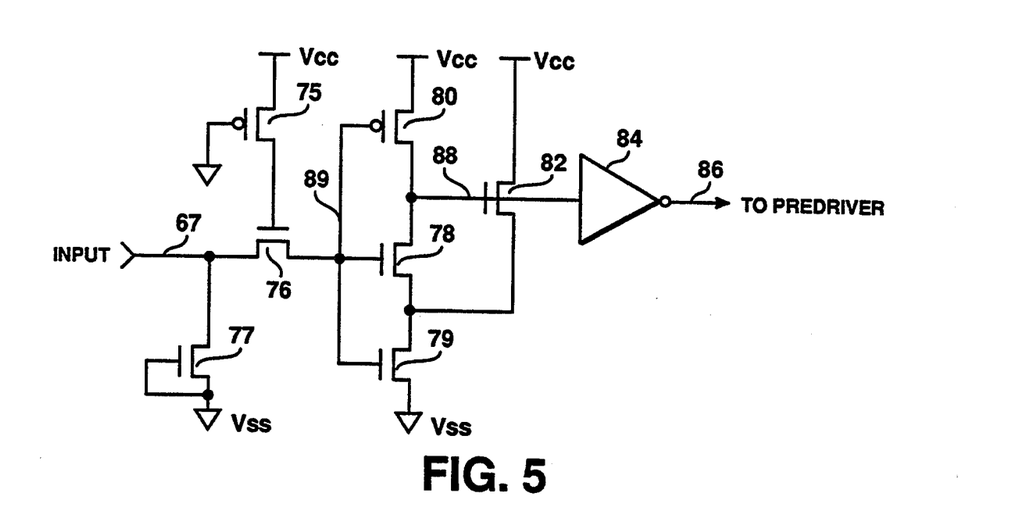
FIG. 5 is a circuit schematic of one embodiment of the input buffer section of the present invention.

With reference now to FIG. 5, there is shown one embodiment of a circuit schematic diagram of the 5 volt tolerant input buffer stage of the present invention. First of all note that the predriver logic stage (shown in FIG. 6) of the output buffer utilizes feedback from the input buffer stage as provided at node 86. In this way, the logical level at output pad 10 may effect the drive characteristics of the output buffer. This is done so that the gate-to-source/drain voltage potential of the final stage p-channel transistors does not exceed a predetermined limit under certain potentially problematic conditions as will be described later.

The input to the buffer stage shown in FIG. 5 appears at node 67 which is coupled to device 77 to the supply line $V_{ss}$ (=ground). Device 77 provides secondary ESD protection for both positive and negative voltage spikes. P-channel device 75, shown coupled between core supply potential $V_{cc}$ and the gate of transistor 76, functions to provide resistance, thereby providing additional ESD protection. Because the gate of device 75 is grounded, it is always on. In other embodiments, device 75 could be replaced by another resistor configuration or not even used at all. Thus, due to device 76 with its gate coupled to $V_{cc}$, the highest voltage possible appearing at internal node 89, even if input node 67 is driven externally to 6 volts or beyond, is the supply voltage ($V_{cc}$) minus $V_{TN}$. Assuming that the range on the supply voltage is between 2.7 and 3.6 volts, and the variation on $V_{TN}$ is approximately 0.5 to 0.7 volts, then the range on the upper limit voltage for node 89 is between 2.0 to 3.1 volts. Of course, the voltage on node 89 drops as the voltage on the output pad 10 drops.

Field effect devices 80, 78, 79 and 82 form a input buffer structure commonly referred to as a "Schmitt Trigger". The Schmitt Trigger input buffer structure is utilized to convert TTL level signals applied at the input to full rail CMOS logic signals. The Schmitt Trigger structure also provides an additional benefit of hysteresis. The Schmitt Trigger structure defines the trip points of the input buffer through its device sizes. Note that the logic level at node 86 is the same as the logic node level at input node 67 by virtue of inverter 84.

Figure 6:
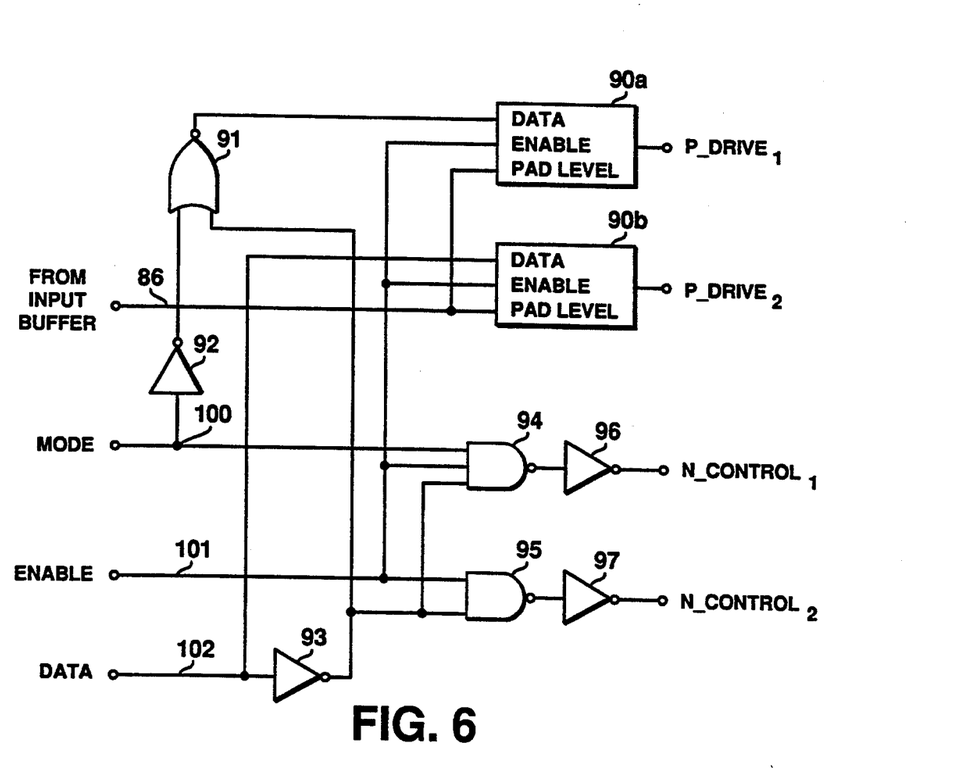
FIG. 6 is a circuit schematic of one embodiment of the predriver logic section of the present invention.

FIG. 6 represents a logic block diagram of the predriver logic stage of one embodiment of the present invention. The predriver logic stage receives the signal generated at node 86 from the input buffer as well as the control signals of "data" and "enable" common to the prior art buffer design. In addition, the control signal labeled "mode" is also present.

The "mode" input of FIG. 6 controls the strength of the final stage of the output buffer of the present invention. In the present embodiment, if the "mode" input is low, then the N_control$_1$ signal output by inverter 96 will be low independent of the "enable" and "data" inputs. Under this condition, one leg of the final stage pull-down devices remain off. Also, with "mode" signal line being low, the output signal P_drive$_1$ is high. This insures that one leg of the final stage p-channel devices remain off.

However, if "mode" is logically high, then the output signal P_drive$_1$ switches concurrently with P_drive$_2$, and N_control$_1$ switches concurrently with N_control$_2$. Further details of the p-channel device predriver circuit blocks 90A and 90B are discussed in detail in conjunction with the circuit schematic of FIG. 7.

Practitioners in the art will appreciate that the "mode" control input applied at node 100 provides a mechanism to alter and control the output buffer strength. Limiting the output buffer strength reduces excessive self-induced switching noise problems. This feature is particularly important for integrated circuits which are housed in plastic packages. Due to the higher supply inductance associated with single-layer plastic packaging product options, it is necessary to provide a mechanism which slows down the output buffers to avoid excessive signal "ringing" and switching noise. Therefore the mode control option of the present invention allows the strength of the output buffer to be controlled to accommodate different packaging options. In addition, variable computer system loading and timing requirements make the buffer's variable strength feature beneficial.

In conventional 5.0 volt ceramic products, both legs of the final stage buffer may be enabled to provide faster switching characteristics. Thus, by using the "mode" input, the design of the present invention provides for two buffer sizes in one.

On the silicon die, a "mode" pad might be implemented with an internal weak pull-up and an inverting input buffer. In this way, in plastic, the mode pad may be left unassembled and all "mode inputs" to the output buffers would be normally pulled low, thereby forcing the buffers into the single leg or weak operating mode. For the strong mode, a bond wire could be connected as part of an assembly option to force the mode pad to ground. This would force the "mode" input at node 100 to a logically high state, thereby enabling the output buffers to operate in their large or strong mode of operation.

It should be understood that the "enable" input illustrated at node 101 in FIG. 6 performs the same function as discussed in conjunction with FIG. 2. That is, for the current embodiment, with the "enable" input high, the output buffer is allowed to switch output pad 10 to logical high or logical low level, depending on the state of the "data" input. With "enable" pulled to a logical low level, the output buffer is tristated.

Obviously, active low "enable" and "mode" signals may also be implemented with slight modifications to the predriver gate logic.

Figure 7:
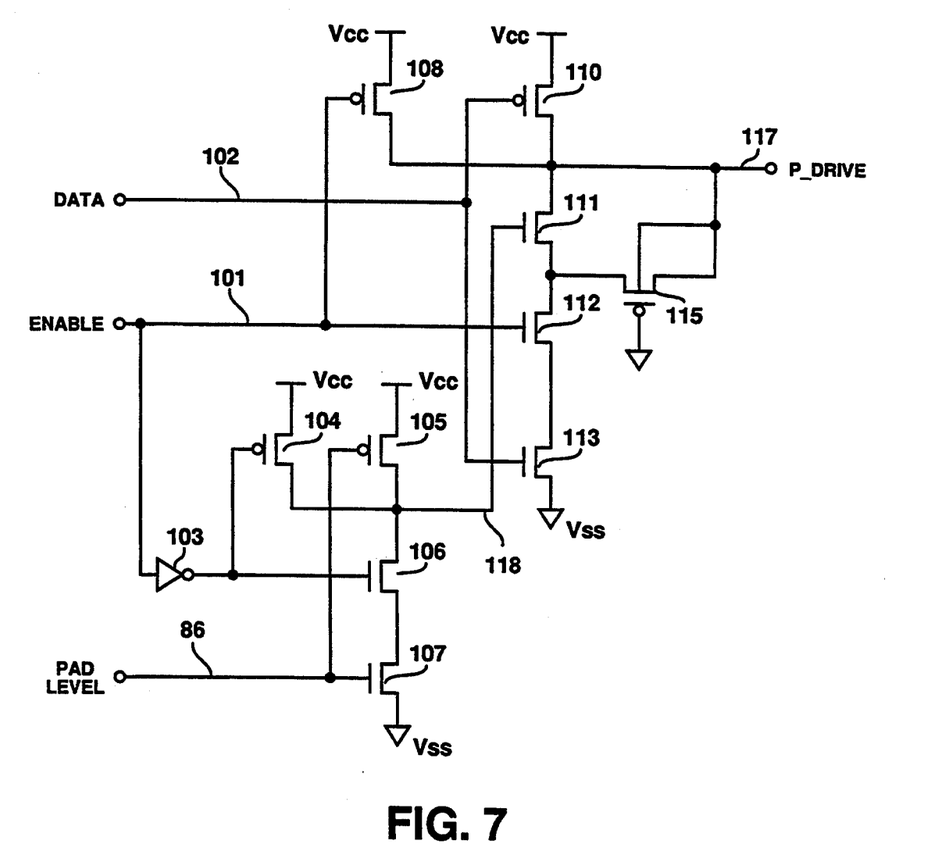
FIG. 7 is a schematic of one embodiment the p-device predriver circuit employed in the present invention.

FIG. 7 illustrates the circuit structure of the special predriver logic blocks 90A and 90B shown in FIG. 6. Blocks 90A and 90B are utilized to drive the p-channel devices of the final stage (see FIGS. 3 and 4). The special circuitry illustrated in FIG. 7 attempts to limit the gate-to-source/drain voltage potential of the final stage p-channel transistors of the output buffer to a predetermined voltage under all possible switching cases. The most problematic case occurs when a 5 volt bus master drives output pad 10 to 5 volts. At the same time, the buffer is required to transition out of tristate and drive a logical 1 onto output pad 10 as the other bus master comes off the bus. Under this condition, a conventional predriver circuitry would drive the gate of the final stage p-channel devices to zero volts as it came out of tristate. Consequently, with 5.0 volts applied to the output pad, and to the p+ silicon drain regions of the final stage p-channel devices and with zero volts on the gates of these devices, there would be a violation of the criteria that guards against p-channel device stability problems.

The predriver circuitry illustrated in FIG. 7 utilizes feedback of the input buffer stage as provided on node 86 (see FIG. 5). In this way, the predriver logic determines if output pad 10 is already logically high when it is desired to drive a "1" to the output pad as the buffer comes out of tristate mode. If the output pad is low when the buffer is coming out of tristate, then the gates of the final stage p-channel devices must be driven to zero volts such that the p-channel devices of the final stage are turned on strongly. This pulls output pad 10 to a logical high level in time to meet maximum delay specifications.

If output pad 10 is already high when the buffer is coming out of tristate, then the gates of the final stage p-channel devices need not to be driven to zero volts, since the pad is already at a logical 1 level. In fact, if output pad 10 is not only logically high, but above $V_{ccp}$ when the buffer comes out of tristate, then the gates of the final stage p-channel devices should not be driven to zero volts in order to guard against violating the gate to source/drain voltage limit. Therefore, by utilizing feedback from the input buffer, the predriver logic stage of the present invention can change the way the voltage is driven on the gates of the final stage p-channel devices (i.e., devices 27 and 28). In order not to violate the prohibition against exceeding a predetermined gate to source/drain voltage while still meeting buffer speed requirements.

As can be seen, field effect devices 108, 110, 112, and 113 form a NAND logic gate that represents a conventional predriver circuit. Additional devices 111 and 115 add a specialized transmission gate between the output of the predriver circuitry at node 117 and the pull down stack of the NAND gate. If device 111 is off, then device 115 insures that the output voltage at node 117 will not be allowed to be pulled all the way down to ground level (i.e., $V_{ss}$). Inverter 103 and devices 104, 105, 106 and 107 in FIG. 7 provide a self-timed delay for the gate of device 111, i.e., node 118. The delay generated by these devices is important for the following condition.

Assume that the input buffer stage circuitry has determined that output pad 10 is in a logical high state (i.e., the output voltage is above the trip point of the input buffer) when the "enable" signal rose. Under this situation, the output of inverter 103 will gradually transition low. This, in turn, causes device 104 to pull up node 118. The delay between the rise of the "enable" signal at node 101, and the rise of node 118 represents the period when device 115 is utilized to step up the voltage on the output "p drive" node 117. After node 118 has risen, it remains high as long as the "enable" input remains high, regardless of the pad level signal on node 86. When the data input at node 102 is low, the P_drive output node 117 is driven to the supply voltage, and the voltage at node 118 becomes unimportant.

It should be understood that when the delay between the rise of "enable" to the rise of node 118 is required, this delay should be long enough to allow the output pad voltage to drop below the voltage necessary to prevent p-device stability problems before the gates of the final stage p-channel devices are driven to zero volts. Thus, the circuit of FIG. 7 solves a potential p-device stability problem which resulted in prior art designs where the gate of the final stage p-channel devices is driven to zero volts when coming out of tristate, even if the output pad was previously at a high potential. Conversely, it is worth noting that for the case when the output buffer comes out of tristate and must drive a logical "1" to output pad 10, and pad 10 was previously at a low voltage, node 118 will already be in a high logic state, and device 111 will be on. Therefore, the output node 117 can quickly be driven to zero volts so that the buffer will turn on strongly.

Figure 8:
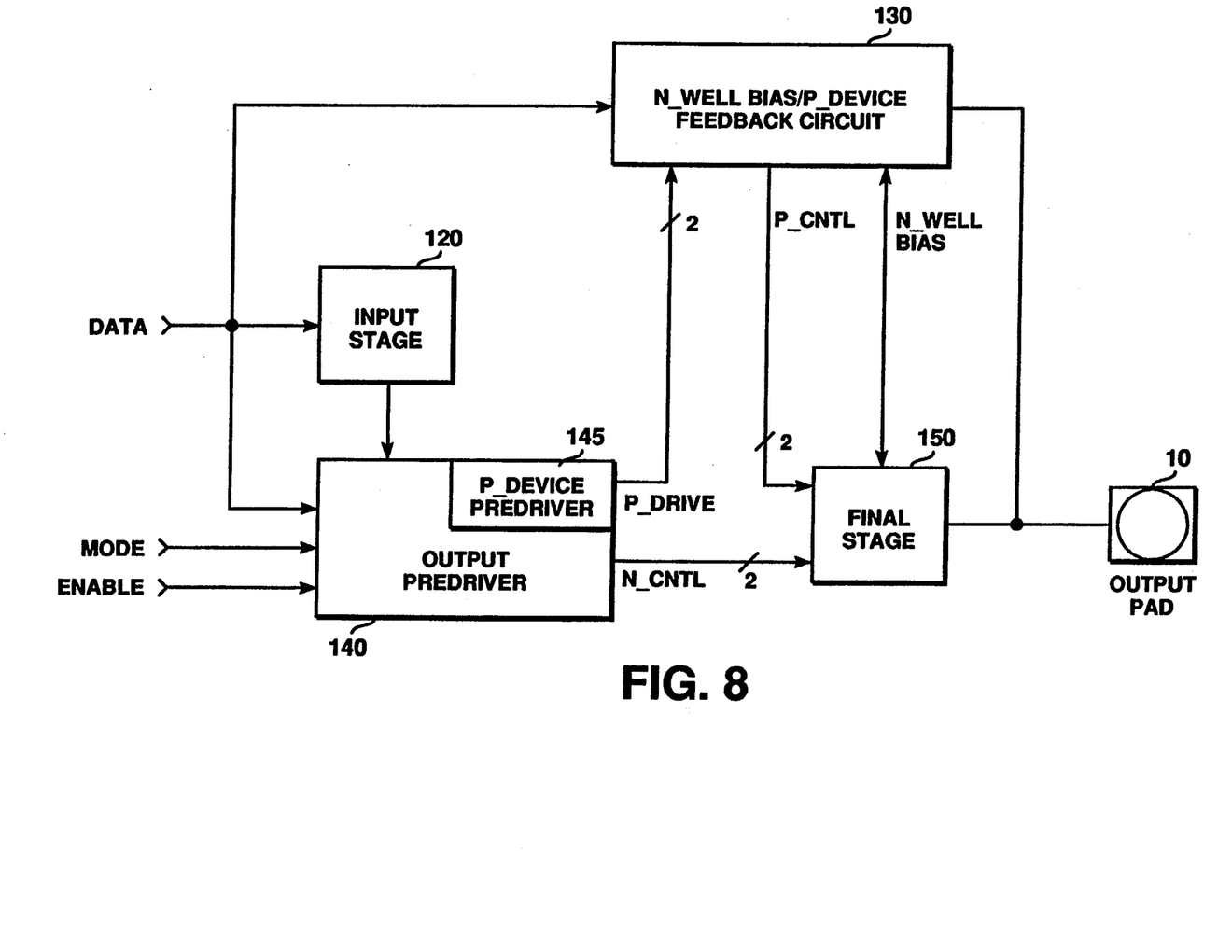
FIG. 8 is a generalized block diagram of one embodiment of the present invention.

FIG. 8 illustrates a overall block diagram of the output buffer of the present invention. Note that input stage circuitry 120 is coupled to receive the input data and provide an output coupled to the output predriver circuitry 140. As described earlier, the output predriver circuitry 140 receives "data" in addition to "mode" and "enable" input signals. The output predriver circuitry also includes p device predriver circuit 145 which provides the pair of P_drive signals coupled to feedback circuitry 130. Output predriver circuit 140 also provides the N_control signal pair to final stage circuitry 150. Feedback circuit 130 couples the data input signal to output pad 10 as well as provides P_control signal lines to final stage circuitry 150. The n-well bias circuitry incorporated into block 130 is couple to the n-wells of the p-channel devices in final stage 150. Final stage 150 receives the P_control and N_control signals from circuits 130 and 140, respectively so as to control the switching of the output pad 10.

I claim:
1. A CMOS tristateable output buffer operable from a low-voltage power supply, said buffer tolerating a relatively high voltage at an output node when said buffer is in a tristate mode of operation, said buffer comprising:
an output predriver circuit generating a pair of drive signals and a first pair of control signals in response to an enable signal and a mode signal, one of said pair of control signals being driven low and one of said pair of drive signals being driven high whenever said mode signal is inactive, said first pair of control signals being driven low and said pair of drive signals being driven high whenever said enable signal is inactive such that said buffer is in said tristate mode;
a second pair of control signals coupled to said pair of drive signals and also coupled to said output node;
a final stage circuit coupled to said output node and also coupled to receive said first pair of control signals and said second pair of control signals, said final stage circuit providing relatively fast switching at said output node when said mode signal is active, and relatively slow switching at said output node when said mode signal is inactive; and
a feedback circuit coupled to said output node, said feedback circuit receiving said pair of drive signals from said output predriver circuit and generating said second pair of control signals in response.

2. The output buffer of claim 1 wherein said final stage circuit includes a pair of p-channel devices, each coupled between said output node and said low-voltage power supply and each having a gate coupled to a respective one of said second pair of control signals.

3. The output buffer of claim 2 wherein said p-channel devices are disposed within an n-well, and further comprising bias circuitry for biasing said n-well to said low-voltage power supply when said output node is at a voltage less than said low-voltage power supply, and for biasing said n-well to track said output node when said output node is at a voltage which exceeds said low-voltage power supply.

4. The output buffer of claim 3 wherein said final stage further comprises first and second n-channel devices coupled in parallel between said output node and ground, each device having a gate coupled to a respective one of said first pair of control signals.

5. The output buffer of claim 3 wherein said final stage further comprises first, second, third and fourth n-channel devices, said first and second n-channel devices being coupled in series between said output node and ground, and said third and fourth n-channel devices being coupled in series between said output node and ground, said first and third n-channel devices having their gates coupled to said low-voltage supply, and said second and fourth n-channel devices having their gates coupled to said first pair of control signals.

6. The output buffer of claim 1 wherein said low-voltage power supply is approximately equal to 3.3 volts.

7. The output buffer of claim 6 wherein said relatively high voltage is approximately 5 volts.

8. The output buffer of claim 1 further comprising:
an input circuit converting a signal at said output node to an internal signal; and
a second feedback path coupling said input circuit to said output predriver circuit to couple said internal signal to said output predriver circuit generation of said pair of drive signals, said second feedback path for reducing voltage stresses in said final stage circuit, wherein said output predriver circuit is responsive to said internal signal in the generation of said pair of drive signals.

9. The output buffer of claim 8 wherein said signal at said output node is compatible with transistor-transistor logic (TTL) levels.

10. The output buffer of claim 8 wherein said input circuit comprises:
an input buffer having an input node;
a first n-channel device having a drain coupled to said output node, a source coupled to said input node, and a gate coupled to said low-voltage power supply.

11. The output buffer of claim 10 wherein said input buffer comprises a Schmitt Trigger device.

* * * * *